US008188428B2

(12) United States Patent
Yamaguchi et al.

(10) Patent No.: US 8,188,428 B2
(45) Date of Patent: May 29, 2012

(54) SCANNING ELECTRON MICROSCOPE

(75) Inventors: Kohei Yamaguchi, Hitachinaka (JP);
Kenji Obara, Kawasaki (JP)

(73) Assignee: Hitachi High-Technologies Corporation, Tokyo (JP)

( * ) Notice: Subject to any disclaimer, the term of this patent is extended or adjusted under 35 U.S.C. 154(b) by 62 days.

(21) Appl. No.: 12/770,244

(22) Filed: Apr. 29, 2010

(65) Prior Publication Data
US 2010/0213371 A1 Aug. 26, 2010

Related U.S. Application Data

(63) Continuation of application No. 11/984,319, filed on Nov. 15, 2007, now Pat. No. 7,732,765.

(30) Foreign Application Priority Data

Nov. 17, 2006 (JP) ................................. 2006-311599
Nov. 27, 2006 (JP) ................................. 2006-319201

(51) Int. Cl.
*H01J 37/28* (2006.01)
(52) U.S. Cl. ......... 250/310; 250/306; 250/307; 430/297
(58) Field of Classification Search ............... 250/306, 250/307, 309, 310, 311; 430/296, 297, 298
See application file for complete search history.

(56) References Cited

U.S. PATENT DOCUMENTS

| 6,259,094 | B1 * | 7/2001 | Nagai et al. .................... 250/310 |
| 6,538,249 | B1 | 3/2003 | Takane et al. |
| 7,075,077 | B2 | 7/2006 | Okuda et al. |
| 2003/0111602 | A1 * | 6/2003 | Sato et al. .................... 250/310 |
| 2003/0193025 | A1 | 10/2003 | Takagi |
| 2004/0065825 | A1 | 4/2004 | Asaki et al. |
| 2005/0258366 | A1 | 11/2005 | Honda et al. |
| 2007/0023658 | A1 * | 2/2007 | Nozoe et al. .................... 250/310 |
| 2007/0170358 | A1 | 7/2007 | Yamaguchi et al. |

FOREIGN PATENT DOCUMENTS

JP 01-304647 12/1989
(Continued)

OTHER PUBLICATIONS

Japanese Office Action, w/ English translation thereof, Issued in Japanese Patent Application No. 2007-297380, dated Jan. 5, 2012.

*Primary Examiner* — David A Vanore
*Assistant Examiner* — Nicole Ippolito
(74) *Attorney, Agent, or Firm* — McDermott Will & Emery LLP

(57) ABSTRACT

A technique executes autofocus adjustment stably even when a plurality of patterns or foreign matter capable of being imaged only by a specific detector are included independently. Such an image as a concavo-convex image having a weak contrast can be picked up. The technique can automatically focus such an image even when it is difficult to find a focus position in the image. A scanning electron microscope includes a plurality of detectors for detecting secondary signals from a specimen when irradiated with an electron beam, and a calculation unit for combining the signals obtained from the detectors. At least two of the detectors are provided to be symmetric with respect to the electron beam. The focus of the electron beam is adjusted based on the signals of the detectors or on a signal corresponding to a combination of the signals.

7 Claims, 14 Drawing Sheets

FOREIGN PATENT DOCUMENTS

| | | |
|---|---|---|
| JP | 2000-260380 | 9/2000 |
| JP | 2001-84944 | 3/2001 |
| JP | 2002-083563 | 3/2002 |
| JP | 2002-110079 | 4/2002 |
| JP | 2003-207315 | 7/2003 |
| JP | 2004-047747 | 2/2004 |
| JP | 2005-005055 | 1/2005 |
| JP | 2005-285746 | 10/2005 |
| JP | 2005-332593 | 12/2005 |
| JP | 2007-200718 A | 8/2007 |

* cited by examiner

SCANNING ELECTRON MICROSCOPE

RELATED APPLICATIONS

This application is a Continuation of U.S. patent application Ser. No. 11/984,319, filed on Nov. 15, 2007, now U.S. Pat. No. 7,732,765, claiming priority of Japanese Application Nos. 2006-311599, filed on Nov. 17, 2006 and 2006-319201, filed on Nov. 27, 2006, the entire contents of each of which are hereby incorporated by reference.

BACKGROUND OF THE INVENTION

The present invention relates to scanning electron microscopes and more particularly, to a scanning electron microscope which performs autofocus adjustment on a plurality of types of images having different features.

For increasing the yield of semiconductor devices, an inspection step is indispensable. For increasing a production efficiency by locating a cause of yield reduction, an electron microscope for inspecting and identifying an abnormality in a wafer is indispensable. For efficient inspection, it is indispensable to speed up the inspection and thus it is desirable to inspect a number of points in a short time.

One of the elements to be considered for the inspection speed-up is an autofocus adjustment function of adjusting the focus of an image in an electron microscope, which function is indispensable for picking up a clear image. One of such functions is disclosed, for example, in JP-A-2005-332593 as a method of achieving accurate autofocus. In the autofocus adjustment function disclosed in JP-A-2005-332593, a plurality of images are acquired by changing a focus, high frequency responses for these images are calculated, and a focus position corresponding to biggest one of the responses is calculated for automatic focus adjustment.

SUMMARY OF THE INVENTION

In the case of a semiconductor wafer, various sorts of foreign matter or defects causing faulty device operation may be present in the wafer. The wafer may have, for example, a relatively observable pattern edge, such that substantially no height of stain-like foreign matter of a chemical should still remain after chemical removal. An example of a defect then is a very low level of raised and recessed portions on the surface such as a scratch caused by polishing operation. As another example, a low level of hard-to-observe and hemi-spherical raised and recessed portions may be caused when a thin film is formed on the wafer, because the film is formed on the wafer already including such an irregularity. Some of the aforementioned systems, including a microscope for inspecting such foreign matter or defects, can acquire a plurality of images having different physical characteristics using a plurality of detectors. The system picks up an image according to the feature of detected foreign matter or defects. When a plurality of sorts of foreign matter or defects capable of being detected only in the image of each detector are present, however, there occurs such a situation that the aforementioned autofocus adjustment function cannot cope with it.

Consider a case which follows as an example. FIG. 1 schematically shows a cross-sectional view of an electron microscope, with only constituent elements necessary for explanation shown therein. In the drawing, reference numerals 122 and 123 denote detectors which play a role of detecting secondary electrons or reflected electrons emitted from a wafer when irradiated with an electron beam emitted from an electron gun 101. An image of signals detected by the detectors can be confirmed by establishing synchronism between the scanning of the electron beam issued from the electron gun and a scan signal of a monitor (display) 117.

In general, a secondary electron emitted from a specimen when irradiated with an electron beam is defined as having an energy of 50 eV or less. An electron emission efficiency varies from specimen to specimen, and such secondary electrons appear on a display screen in the form of black and white grayscale. Such a corner as an edge of a pattern is featured by having the amount of secondary electrons generated larger than that at the other area even for the same substance. Meanwhile, a reflected electron is defined as having an energy of 50 eV or more, has a property of reflecting the shape of the irradiated material, and the yield is changed with the installation direction of the detector. For example, as to a shallow hole area in a specimen, a part of the hole which faces the detector appears as a bright part; whereas, a part of the hole which is opposed to the detector appears as a dark part. For example, utilizing the above property, when the detectors are located to be opposed to each other, a pair of shadow images having different shades can be acquired. Since the behavior of secondary or reflected electrons emitted from the specimen varies with physical conditions or with an electric field between the specimen and the detector, it is difficult for each detector to distinguish between the secondary and reflected electrons and detect them. However, a certain degree of yield can be attained by controlling the locations of the detectors or the electric field.

In the prior art, focus adjustment has been carried out by using either an image generated from a secondary signal detected by a secondary electron detector or an image generated from a secondary signal detected by a reflected electron detector. However, in the prior art, it is difficult, in all cases, to achieve suitable automatic adjustment. For example, consider situations where a specimen has substantially no thickness of stain-like foreign matter or where a specimen has concavities and convexities which have few difference in height, in an area other than a pattern. In the former case, the stain-like foreign matter clearly appears in a secondary electron image, but does not substantially appear in a reflected electron image because the stain has substantially no thickness. Meanwhile, the concavities and convexities clearly appear in the reflected electron image, but do not clearly appear in the secondary electron image, because the concavities and convexities include no difference of a material and no edge. For this reason, when a defect is detected on the basis of an based on the detector for detecting secondary electrons (hereinafter referred to as a secondary electron image), the use of an image based on the detectors for detecting reflected electrons (hereinafter referred to as a reflected electron image) and including a defect may, in some cases, result in the system not correctly performing its automatic adjustment which results in an out of focus image. The same holds true for the opposite case. When the specimen includes a circuit pattern or the like around the foreign matter, adjustment can be carried out based on its image. When the specimen includes no such circuit pattern, however, the adjustment cannot be carried out based on the image.

As has been mentioned above, the prior art has a problem that, when a specimen includes such foreign matter and a pattern capable of being picked up only by a specific detector respectively and independently, accurate autofocus adjustment cannot be achieved based on a single image by a detector.

It is therefore an object of the present invention to provide a technique for stably achieving autofocus adjustment even when a specimen includes a plurality of patterns or foreign matter appeared in an image only by a specific detector respectively and independently. An object of the present invention is also to provide a technique for achieving automatic adjustment even when it is hard to find a focus position in such an image having a weak contrast as a concavo-convex image, though the image can be picked up.

Some or all of the above objects may be attained for example by a scanning electron microscope which includes a plurality of detectors for detecting secondary signals from a specimen when irradiated with an electron beam emitted from an electron gun, and a calculation unit for combining the signals obtained from the detectors. In the exemplary scanning electron microscope, at least two of the detectors are arranged to be axially symmetric with respect to the electron beam, and a focal point of the electron beam is adjusted on the basis of the respective signals of the detectors or the combined signal thereof.

In accordance with another aspect of the present invention, there is provided a scanning electron microscope which includes an electron lens for converging an electron beam emitted from an electron gun onto a specimen, a pair of first and second detectors and a third detector for detecting secondary signals from secondary electrons emitted from the specimen when irradiated with the electron beam, the first, second and third detectors being provided to be spaced from each other by a predetermined spacing; a storage unit for generating and storing first, second and third pieces of secondary signal data from the secondary signals detected by the first, second and third detectors for focuses of the electron beam to the specimen changed by a plurality of times; a data calculation unit for combining first, second and third pieces of secondary signal data for the respective focuses; a focus adjustment unit for calculating an evaluation value on the basis of an intensity signal obtained by subjecting the combined secondary signal data for the focuses to predetermined data conversion and adjusting the focus of the electron beam to the specimen using a focus calculated based on the evaluation values of the focuses.

In accordance with a further aspect of the present invention, there is provided a scanning electron microscope which includes an electron lens for converging an electron beam emitted from an electron source onto a specimen; a pair of first and second detectors and a third detector for detecting secondary signals obtained from the specimen when irradiated with the electron beam, the first, second and third detectors being provided to be spaced in each pair from each other by a predetermined spacing; a storage unit for generating and storing first, second and third pieces of secondary signal data from the secondary signals detected by the first, second and third detectors for respective focuses of the electron beam to the specimen changed by a plurality of times; a data calculation unit for calculating the first, second and third pieces of secondary signal data at the respective focuses; a detector selection unit for selecting at least any one of the first, second and third detectors; and a focus adjustment unit for generating secondary signal data from the detector selected by the detector selection unit by changing the focus of the electron beam, finding an evaluation value of the secondary signal data for the focuses changed based on intensity signals obtained by subjecting the generated secondary signal data to predetermined data conversion, determining a fitting function corresponding to the evaluation value, calculating an error between the evaluation value and the fitting function, adjusting the focus of the electron beam to the specimen using a focus giving a peak value to the fitting function when the error is in a predetermined reference range, selecting the detector different from the detector selected by the detector selection unit when the error is out of the predetermined reference range, calculating an error between the evaluation value and the fitting function with respect to the different detector, and adjusting the focus of the electron beam to the specimen using focuses having the errors lying in the predetermined reference range.

For the purpose of establishing stable autofocus adjustment at all times, the present invention can create a combined image using all or some of images picked up by a plurality of detectors and can attain the autofocus adjustment. Even when a specimen includes such a pattern as to be observable only by a specific detector or includes a plurality of foreign matter independently or even when an image has such a low contrast as to make it difficult to achieve focus adjustment, the present invention can stably perform the autofocus adjustment.

Furthermore, when an image that is capable of being picked up only by a specific detector is included in the images, an electron microscope having a plurality of detectors can achieve stable autofocus adjustment by picking up images by each detector while changing a focus position (Z), creating a combined image using part or some of the images, and evaluating the combined image. Thus even when it is difficult to achieve autofocus adjustment with use of a single image, the present invention can detect a just-focused position.

Other objects, features and advantages of the invention will become apparent from the following description of the embodiments of the invention taken in conjunction with the accompanying drawings.

DESCRIPTION OF THE INVENTION

Figure 1:
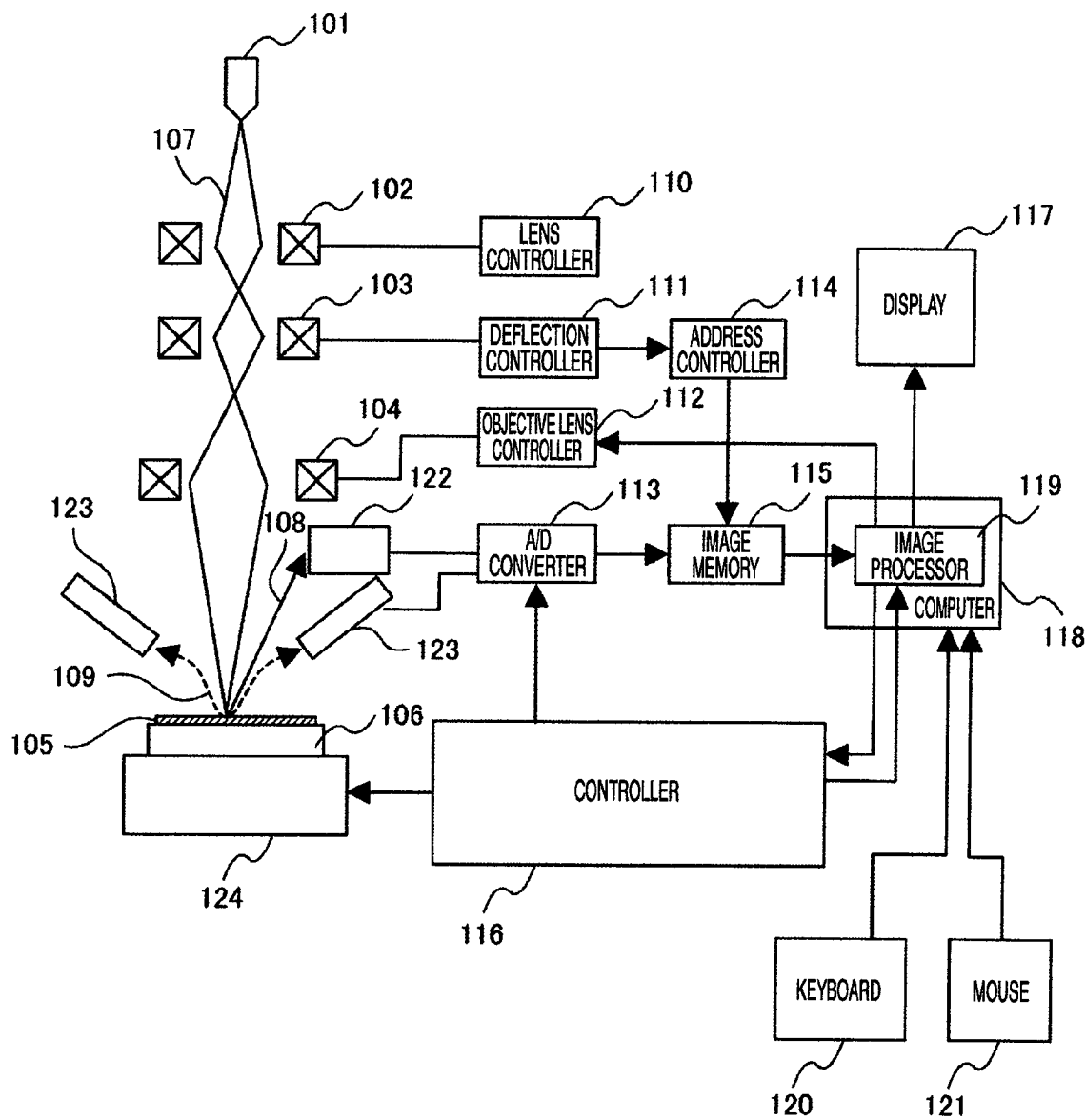
FIG. 1 shows an arrangement of a scanning electron microscope to which the present invention is applied.

A scanning electron microscope shown in FIG. 1 includes an electron gun 101, a lens 102, a deflector 103, an objective lens 104, a specimen carrier base 106, a lens controller 110, a deflection controller 111, an objective lens controller 112, an analog/digital converter 113, an address controller 114, an image memory 115, a control unit 116, a display 117, a computer 118, an image processor 119, a keyboard 120, a mouse 121, a secondary particle detector 122, a pair of reflected electron detectors 123, and an input unit to a movement stage 124. The microscope also includes a specimen 105, an electron beam 107, a secondary electron 108, and a reflected electron 109. In the drawing, a column for keeping a vacuum in the microscope is omitted. The pair of reflected electron detectors 123 are located at positions opposed to each other with respect to a straight line to pick up a dual shadow image, but such a location is not limited to such an example as shown in the drawing.

The electron beam 107 emitted from the electron gun 101 is converged by the lens 102, two-dimensionally scanned and deflected by the deflector 103, converged by the objective lens 104, and then applied to the specimen 105. The application of the electron beam 107 to the specimen 105 causes the secondary electrons 108 or the reflected electrons 109 to be emitted from the specimen according to the shape or the material of the specimen. These secondary electrons 108 and reflected electrons 109 are detected by the detectors 122 or 123, amplified, and then converted to digital values by the analog/digital converter 113. Signals from the pair of reflected electron detectors 123 are used to form L and R images as reflected electron images; while a signal from the detector 122 is used to form an S image as a secondary electron image. Data on the converted digital values is stored in the image memory 115. As an address in the image memory 115 at this time, the address controller 114 generates an address synchronized with a scan signal of the electron beam. The image memory 115 transmits, as necessary, image data about the stored SEM image to the computer 118. The computer 118 performs various operations including calculating a focus evaluation value from the image, fitting the function to the evaluation value, calculating a peak on the fitting function, transmitting a focus adjustment signal to the objective lens controller 112, and controlling the objective lens for focus adjustment. The objective lens controller 112 is also used for focus adjustment when an image is picked up during adjustment of the focus position in autofocusing operation. The image processor 119 reads out image data from the image memory 115 and executes its operation. The image processor may have a plurality of functions, but it is required to have at least a function of performing adding or subtracting operation on an image and also a function of performing multiplying operation by a constant value.

The specimen 105 to be observed by the scanning electron microscope is held on the specimen carrier base 106. The movement stage 124 can two-dimensionally move the specimen base under control of a control signal from the control unit 116, whereby the scanning position of the electron beam 107 to the specimen 105 can be changed.

Embodiment 1

Figure 2:
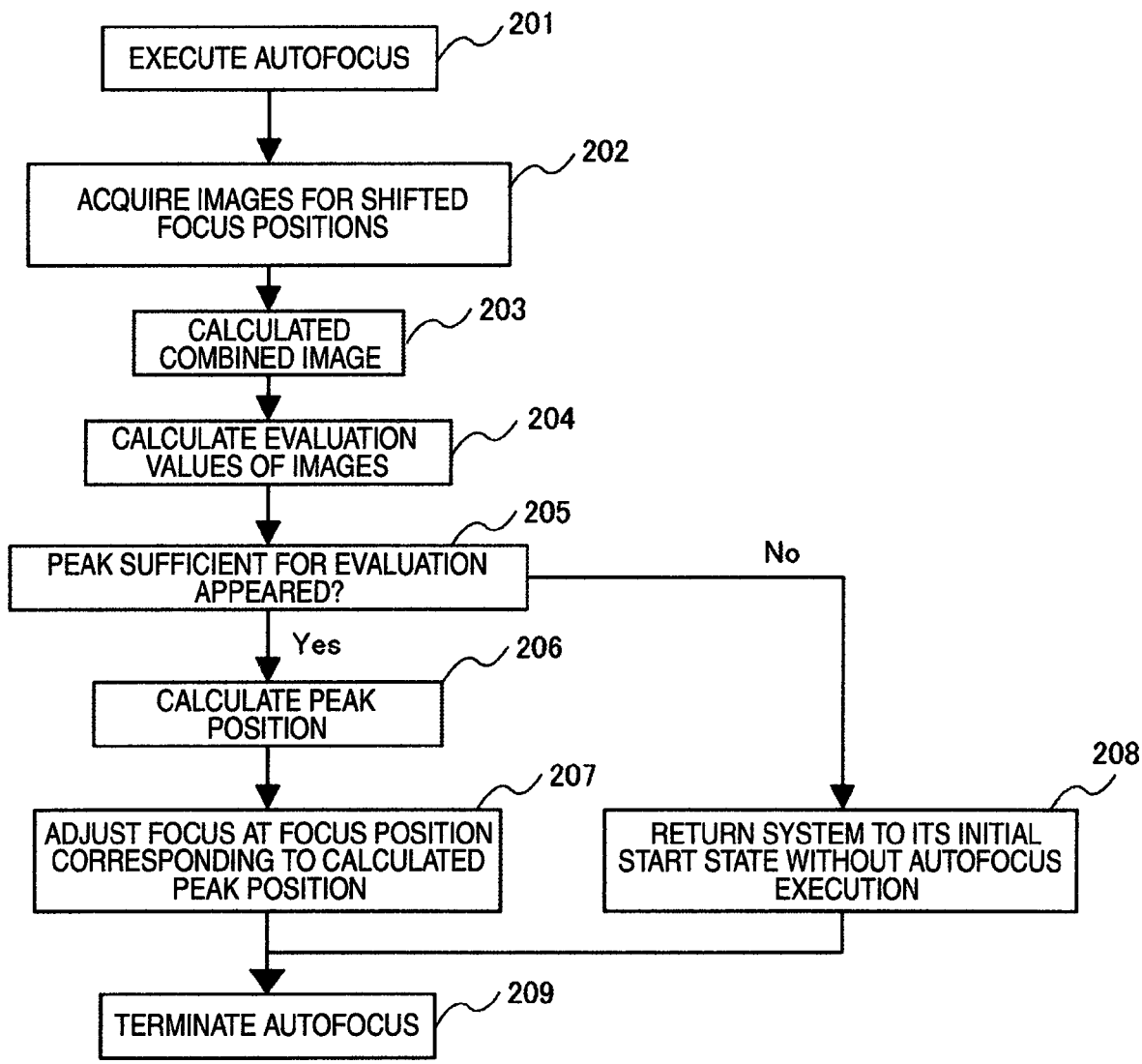
FIG. 2 is a flow chart for explaining the processing contents of an embodiment 1 of the present invention.

FIG. 2 is a flow chart showing a focus adjusting procedure. In FIG. 2, with such an arrangement as mentioned above, focus adjustment is executed according to a procedure of steps 201 to 209. In the step 202, first of all, images by each detector are picked up at focus positions stepwise shifted by the objective lens controller 112. In this step, a set of images with focus states gradually varying with focus movement can be obtained.

In the step 203, next, the set of images are combined. The images acquired in the step 202 are calculated according to a previously-registered equation by the image processor 119.

Figure 3:
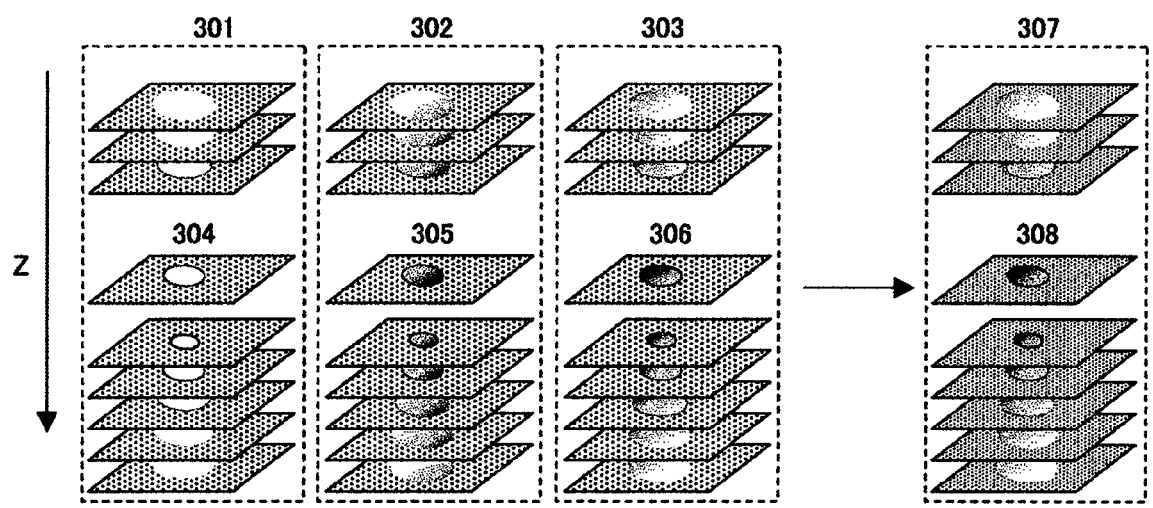
FIG. 3 is a diagram for explaining image acquisition and a calculation target in the autofocus function of the embodiment 1 of the present invention.

FIG. 3 shows a diagram for explaining the processing contents of the step 203. Images are picked up with varying focuses for each detector in the step 202. Groups of images 301, 302, and 303 are images obtained from the detectors of secondary electron, reflected electron (L), and reflected electron (R) respectively. In this connection, the reflected electron (L) indicates an electron detected by one of the detectors 123 in FIG. 1, and the reflected electron (R) indicates an electron detected by the other reflected electron detector 123. A vertical direction indicates a height direction, and the focus state is gradually changed with the movement of the focus. Such images picked up with the same focus as images 304, 305, and 306 are used to create a combined image 308 according to an equation (1) which follows.

$$\alpha \cdot SE + \beta \cdot L + \gamma \cdot R \qquad \text{equation (1)}$$

In this equation, SE, L and R denote addition elements of a secondary electron image, reflected electron L and R images respectively; and $\alpha$, $\beta$ and $\gamma$ denote coefficients of SE, L and R respectively.

In this way, the groups of images 301, 302, and 303 are calculated to create a group of images 307. According to the above equation (1), an image corresponding to an addition of a difference between the reflected electron images to the secondary electron image at a specific rate is output, and a secondary electron image having an enhanced contrast can be obtained. The above equation (1) is not limited to this contents and the addition elements, the coefficients and so on are not limited to the above example.

In the step 203, next, an evaluation value for evaluating the focus state is calculated. The evaluation value is calculated on the basis of a differential value of the image. A pattern edge or the like can be easily observed. However, such an edge at the contour or the like of a focused image has a grayscale level change larger than an edge at the contour in the blurred image. From this viewpoint, a sum of pixel values after the image is differentiated is calculated and the sum is used as the evaluation value. Maximum one of the evaluation values is considered to be equal to a focused position. More specifically, image data is passed through such a differentiation filter as Laplacian to calculate a sum of pixel values as the filtered result.

Figure 5:
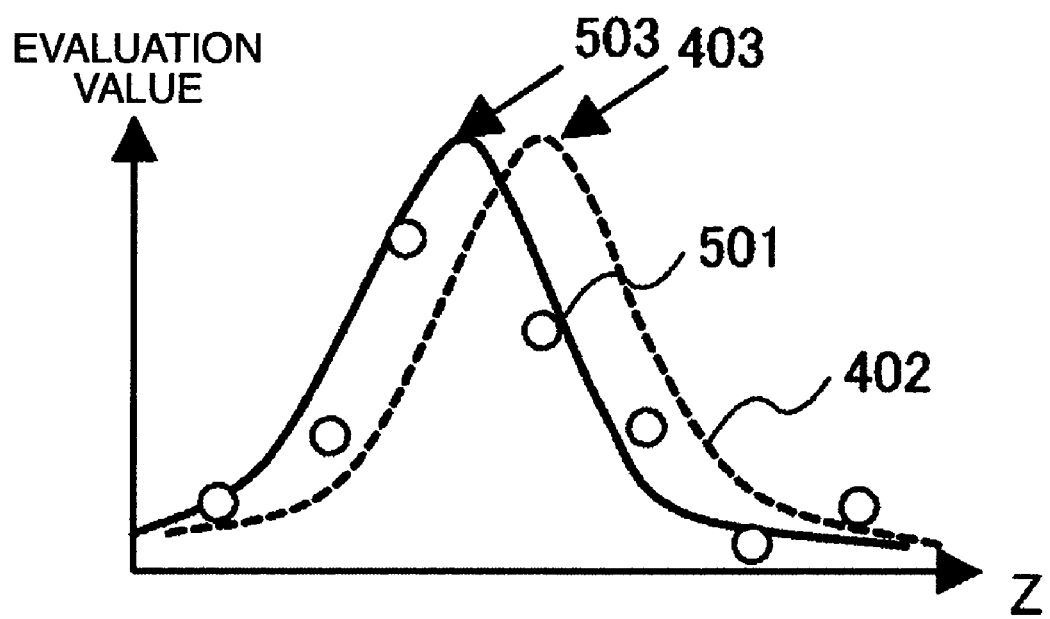
FIG. 5 shows an abnormal profile graph having evaluation values in the embodiment 1 of the present invention.

With respect to such evaluation values, when such a graph having evaluation values as its vertical width and having a focus position (Z) as its horizontal width as shown in FIG. 5 is considered, approximation can be realized with a curve having the maximum evaluation value at the focused position. As the then curve (fitting function), a parabolic curve, a polynomial curve or the like is used. To this end, when the above fitting function is applied to the evaluation value data, a focused position can be found from its peak position.

At this time, with respect to the calculated fitting function, when an offset or deviation from original data is evaluated and an error between the calculated fitting function and the original data is not large, the data can be determined as data usable for calculation of the focused position, and the amount of control of the objective lens to adjust the focus at the focused position can be calculated by finding the peak position of the fitting function.

Figure 4:
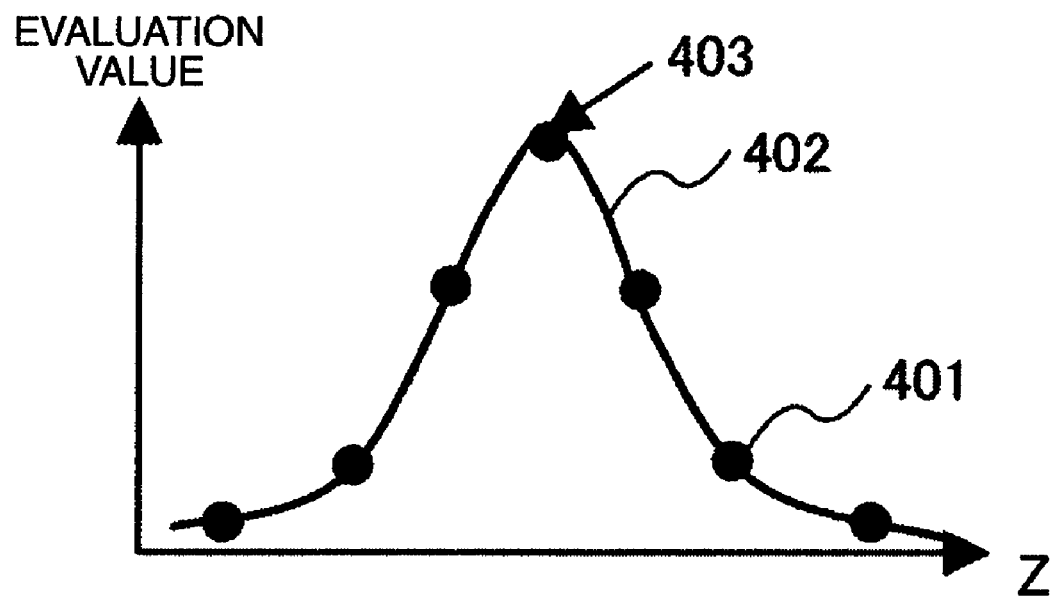
FIG. 4 shows a normal profile graph having evaluation values in the embodiment 1 of the present invention.

When the error is large, this means that the deviation from the fitting function is large. Thus it becomes, in some cases, impossible to calculate a correct peak position. For example, consider cases where one detector has a sufficient image S/N ratio and the other detector has an insufficient image S/N ratio at the same place. In the former case, an evaluation value graph is as shown in FIG. 4. In the graph, a horizontal axis denote focus position (Z), a vertical axis denotes evaluation value, a black dot 401 indicates a plot of an evaluation value from each picture. When the S/N ratio is sufficient, the plots of the evaluation values follow a constant fitting function 402. Thus when a peak position 403 on the fitting function is found, a just-focused position can be correctly calculated. In the latter case where the selection of the detectors is not suitable and the detector has an insufficient S/N ratio due to a pattern or the like, however, the number of noise components is increased. Thus a white dot 501 has an error larger than the black dot 401 when the evaluation value is normal. Even the fitting under this condition results in that the dot fails to indicate the peak position 403 of the fitting function 402 indicative of the correctly focused position and that an erroneous peak position 503 is determined as a peak.

In this way, fitting is carried out using a prescribed fitting function, and an error between the function and the evaluation value is used as a certain rule of thumb for determining whether or not the selected image is suitable for autofocus adjustment. When the data has an error not larger than a constant value, the system goes to the step 206 and a focus position is calculated with the same data. When the peak is insufficient, the system proceeds to the step 208, where no focus calculation is carried out and the states of constituent elements including the objective lens are returned to their initial state. The system then goes to the step 209, thus terminating the autofocus adjustment process.

The system calculates a peak position in the step 206, and then proceeds to the step 207, where a signal is sent to objective lens controller 112 so that the focus position of the lens is adjusted at the focused position for focus adjustment. Since the peak position of the graph of the evaluation value, that is, the peak position 403 in FIG. 4 corresponds to the just-focused position, a control corresponding to the focused position is transmitted. After the completion of the adjustment, the system is shifted to the step 209 to terminate the autofocus adjustment process.

Embodiment 2

Figure 6:
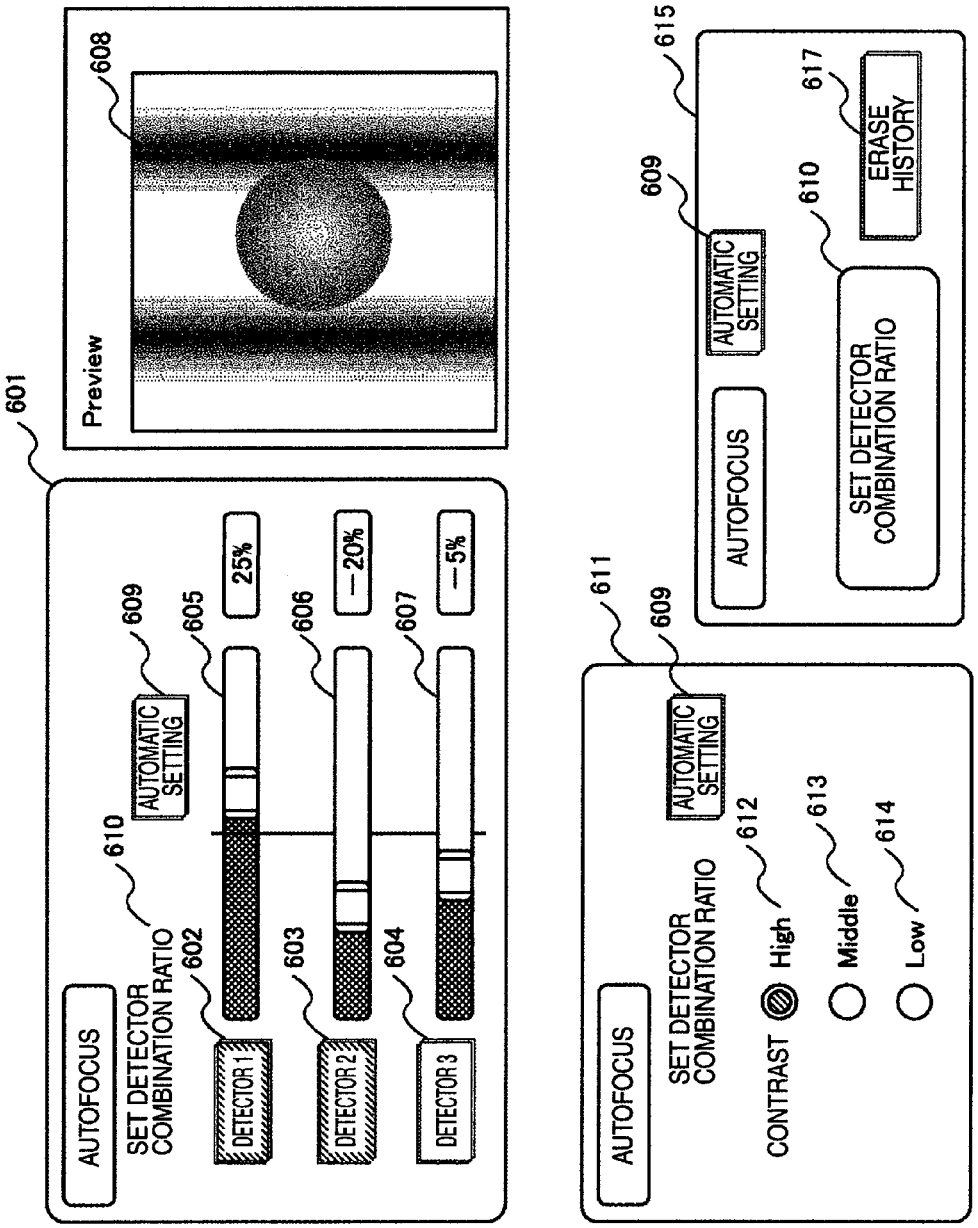
FIG. 6 shows a GUI (Graphical User Interface) used to set calculation contents in an embodiment 2 of the present invention.
Figure 7:
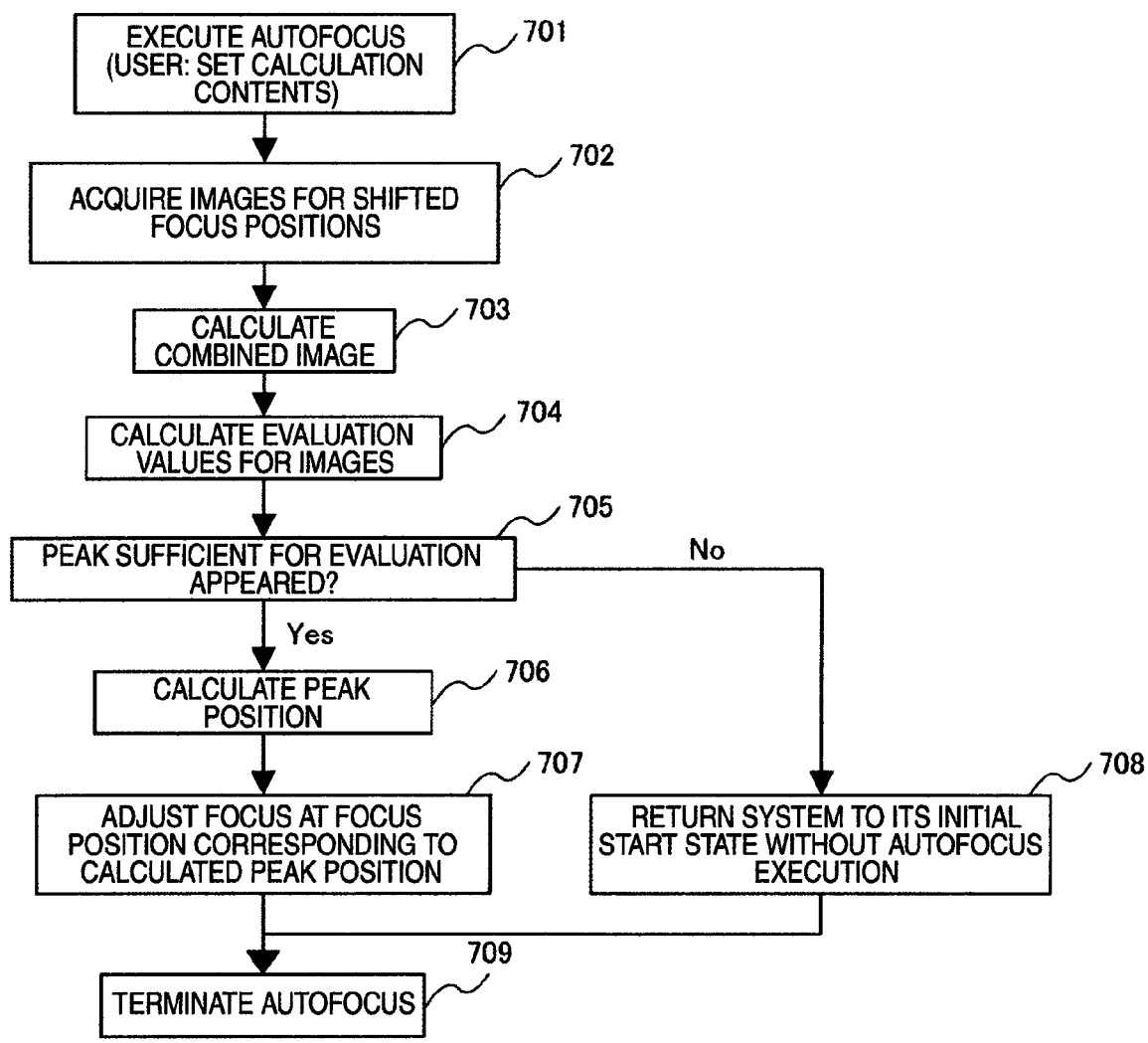
FIG. 7 shows a flow chart for explaining the processing contents of the embodiment 2 of the present invention.

FIG. 7 shows a flow chart of the embodiment 2. The embodiment 2 shows an example which includes the contents of the embodiment 1 and wherein calculation contents can be set by a user. The embodiment 2 is different from the embodiment 1 only in the operation of a step 701 shown in FIG. 7, that is, in that the user sets the calculation contents immediately before the system performs the autofocus adjustment so as to calculate a combined image on the basis of the set calculation contents. The calculation contents can be specified by the user in the form of such contents displayed by a GUI as shown in FIG. 6.

A display screen 601 shown in FIG. 6 is the GUI for setting a coefficient (i.e., image addition ratio) to each detector in the aforementioned equation (1). On the GUI, the user can uniquely set a mixture ratio of respective images in the equation (1) to enhance a focus accuracy according to each image. In this example, the user can set the above ratio by adjusting slide bars 605, 606 and 607 with use of the mouse 121. However, the setting method is not limited only to the example or means on the display screen, and the user may enter numeral values directly with use of such an input unit as the keyboard 120. The user also can specify an image to be mixed with use of buttons 602, 603 and 604. In this example, detectors 1 and 2 are set to be used for calculation, but the display and setting methods are not limited to this example. In place of individually setting the mixture ratios of respective images, the user may select one of a plurality of choices. For example, the GUI can be set so that clicking the mouse on an area 610 causes a display window 611 to appear and, when the user previously sets choices 612, 613 and 614 according to the purpose, the user can select one of the choices according to the purpose. Selection of the choice 612 causes a window 615 to appear. In actual calculation, the user previously sets mixture ratios corresponding to the contents of the respective choices to use them. In this example, since the user can easily select different choices for different purposes, the user, even when he has a bad command of using the system, can easily set it. The displaying and selecting methods of the display window 611 are not limited to the shown example. The function of an automatic selection setting button 609 will be explained layer in connection with an embodiment 3.

In this connection, upon the above setting, when an exemplary image is displayed as a display 608 after the calculation, the user can easily observe the specimen. The image to be then displayed may be an image being currently picked up or an image stored by the user. The image storing method is carried out, for example, by preparing a button for image storage and storing a desired image at arbitrary timing. The image picking-up method, including previously preparing an image and using an image stored in other works, is not limited to the example in the above embodiment. Also contents to be displayed on the display screen are not specifically restricted to the above contents example. n the step 809. The method of again setting the calculation schemes in the step 811 may be executed by sequentially selecting the schemes or also by settereof is omitted.

Embodiment 3

Figure 8:
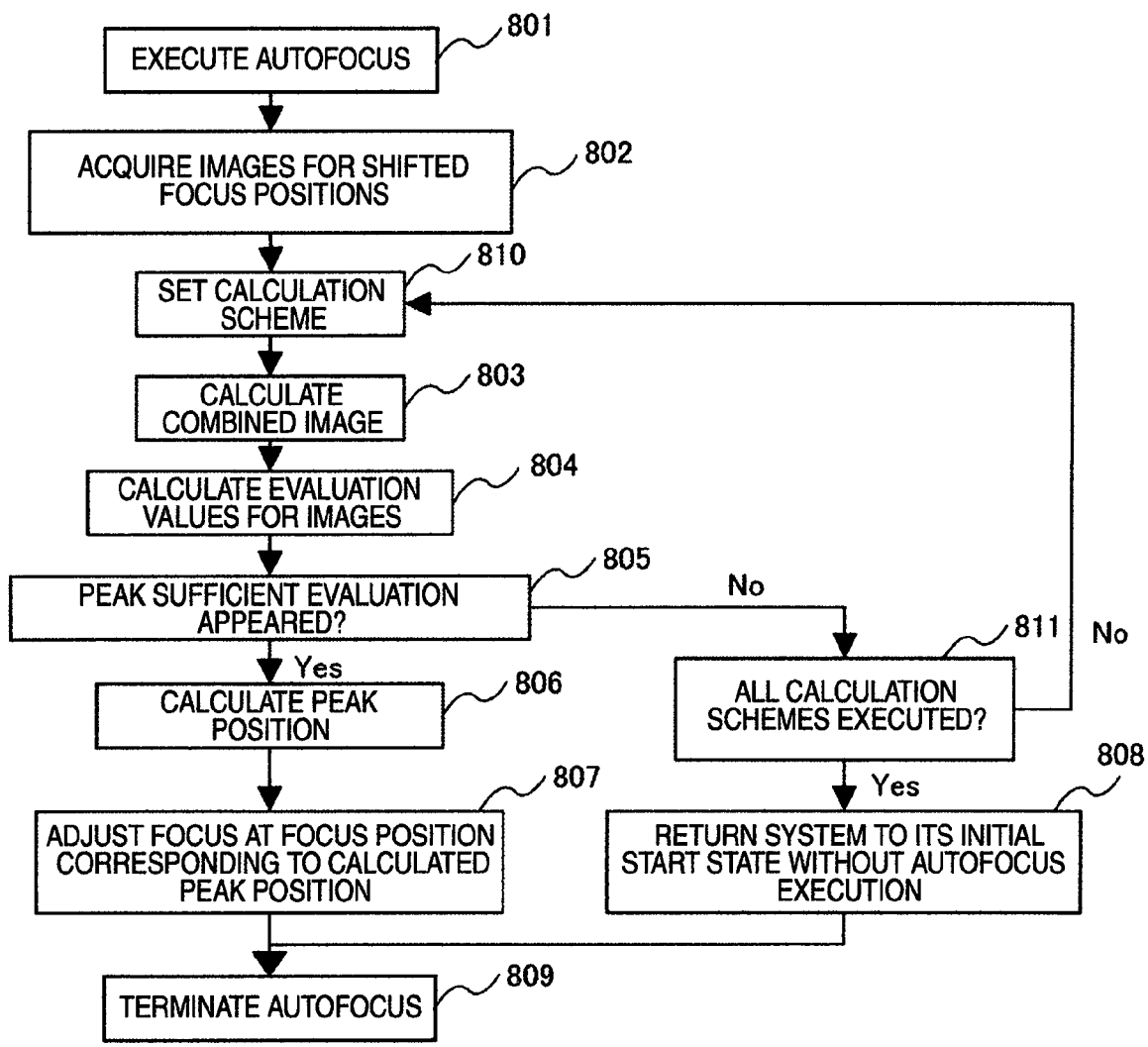
FIG. 8 shows a flow chart for explaining the processing contents of an embodiment 3 of the present invention.
Figure 9:
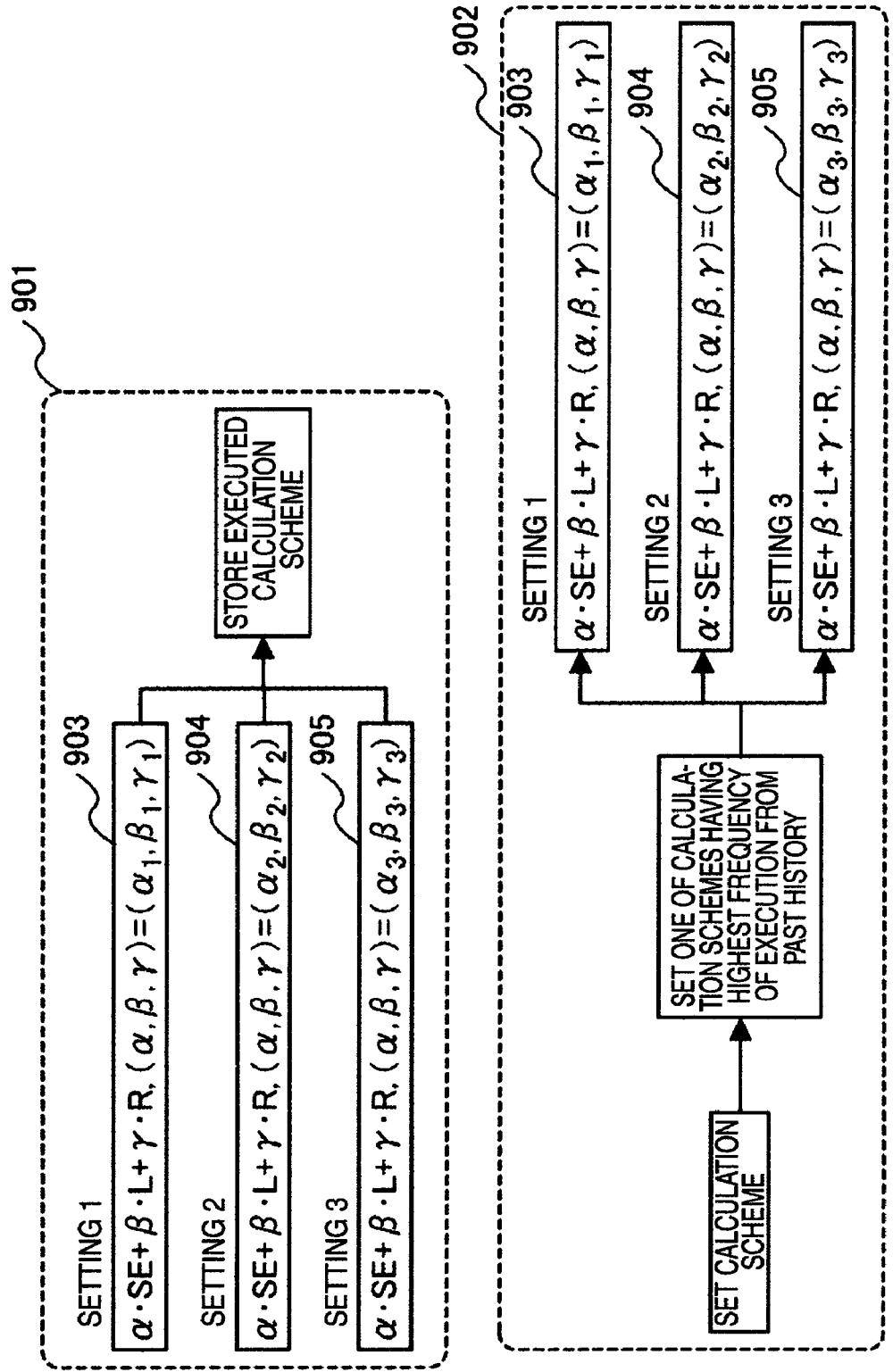
FIG. 9 is a diagram for explaining parameters used in a calculation method selection process in the embodiment 3 of the present invention.

FIG. 8 shows a flow chart of this embodiment 3. The drawing is substantially the same as the embodiment 2, but different therefrom in an image combining system and a parameter selecting method. The difference from the embodiment 2 is a function of automatically setting detectors for acquiring images. FIG. 9 is a diagram for explaining parameters used in a calculation method selecting process in the embodiment 3.

When the user selects the automatic detector selection setting button 609 in FIG. 6, this causes such sets of parameters 903, 904 and 905 as shown by a functional diagram 901 in FIG. 9 to be stored in the computer 118 each time that the autofocusing operation is executed. A step 810 is provided to determine an equation and parameters prior to the image calculation as shown by a functional diagram 902 in FIG. 9. In the determining method, one of the equations having the highest frequency of execution and parameters are set on the basis of history data previously stored. As a result, images effective for focus adjustment can be reliably combined and effective focus adjustment can be achieved. Other steps 801 to 809 are similar to the steps 701 to 709 in the embodiment 2, and detailed explanation thereof is omitted.

When an error from the fitting function is large and the evaluation value is not suitable for evaluation in the step 805, the system goes to a step 811 to execute evaluation in another calculation scheme. When there is another calculation scheme not executed yet in the steps 903, 904 and 905 in the step 811; the system again sets the scheme not executed yet and executes its evaluation in a step 810. When the image evaluation is already executed and confirmed for all the calculation schemes, the system goes to the step 808, where the system performs no autofocus adjustment and terminates its operation in the step 809. The method of again setting the calculation schemes in the step 811 may be executed by sequentially selecting the schemes or also by setting priorities therefor according to a scheme switching method (to be explained later) and selecting the scheme.

The calculation scheme switching method is not limited to the above example. The scheme switching method may be carried out based on probability and statistics, for example, the calculation scheme is determined as a standard scheme without involving its judging operation if the same calculation scheme has been executed a predetermined number of times. The determining operation may be carried out based on information about wafer including chip-in coordinate and chip position and information about wafer processing steps and wafer inspection apparatus. For example, with respect to a wafer after subjected to the operation of a specific step, when an image combined under conditions of the parameters 903 is especially effective for a specific part within a chip, autofocus adjustment can be efficiently obtained by setting the parameters 903 in its coordinated range from the beginning. As data as a reference of the determination, data collected during observation of the wafer or data previously prepared may be used, or data about a combination thereof may be used. With regard to the history information, a function of erasing the history according to user's specification can be set as such an erase button 617 as shown in FIG. 6.

When the user sets such operations, the operations can be set by providing automatic setting items to the GUI for setting of the detectors as one setting, for example, with use of the automatic selection setting button 609 already shown in FIG. 6. This is only an example and the present invention is not limited to the specific example. For example, for the entire autofocus adjustment or settings other than the autofocus adjustment; automatic setting items can be provided with use of, e.g., the choice 612 of FIG. 6, and its calculation scheme can be automatically selected through the aforementioned operation in response to the selection. The setting items are not shown in the GUI. However, it is also possible to automatically select any of the detectors when the buttons 602, 603 and 604 of the GUI are not manually selected.

Embodiment 4

Figure 10:
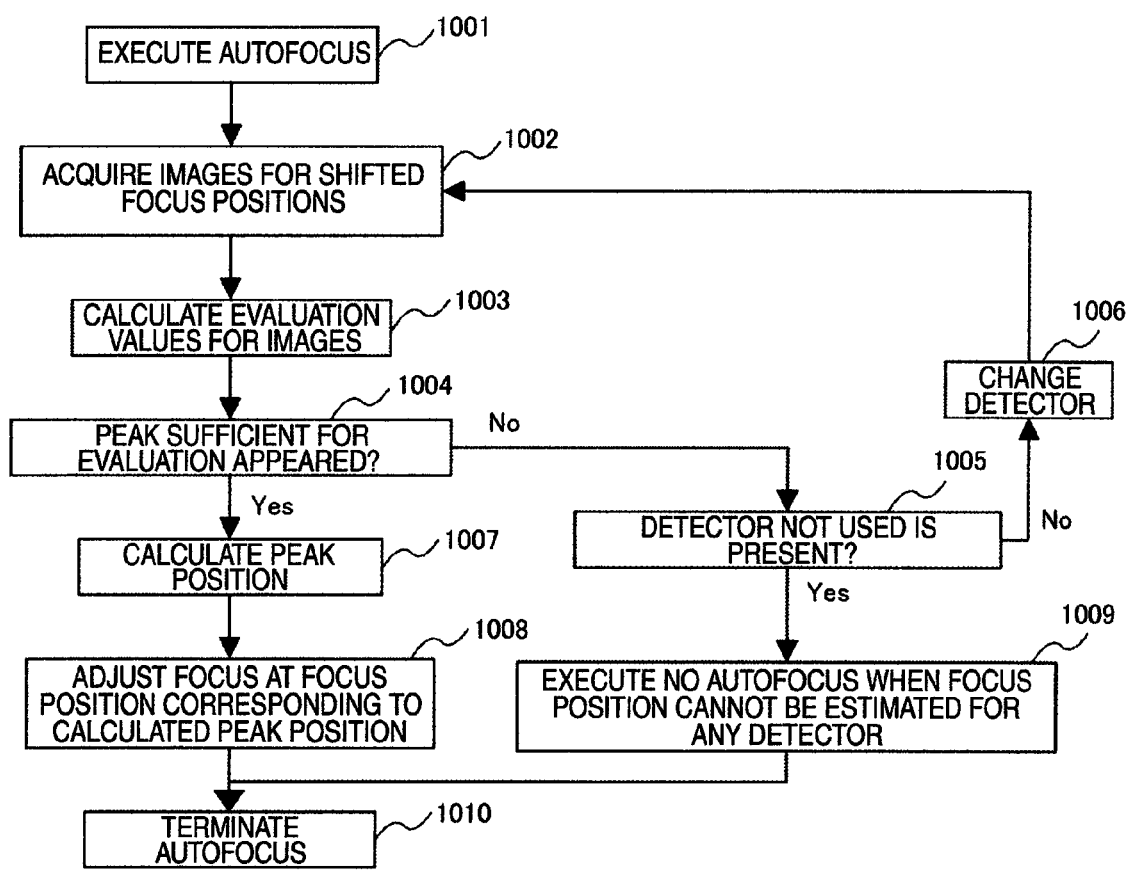
FIG. 10 is a flow chart for explaining the processing contents of an embodiment 4 of the present invention.
Figure 11:
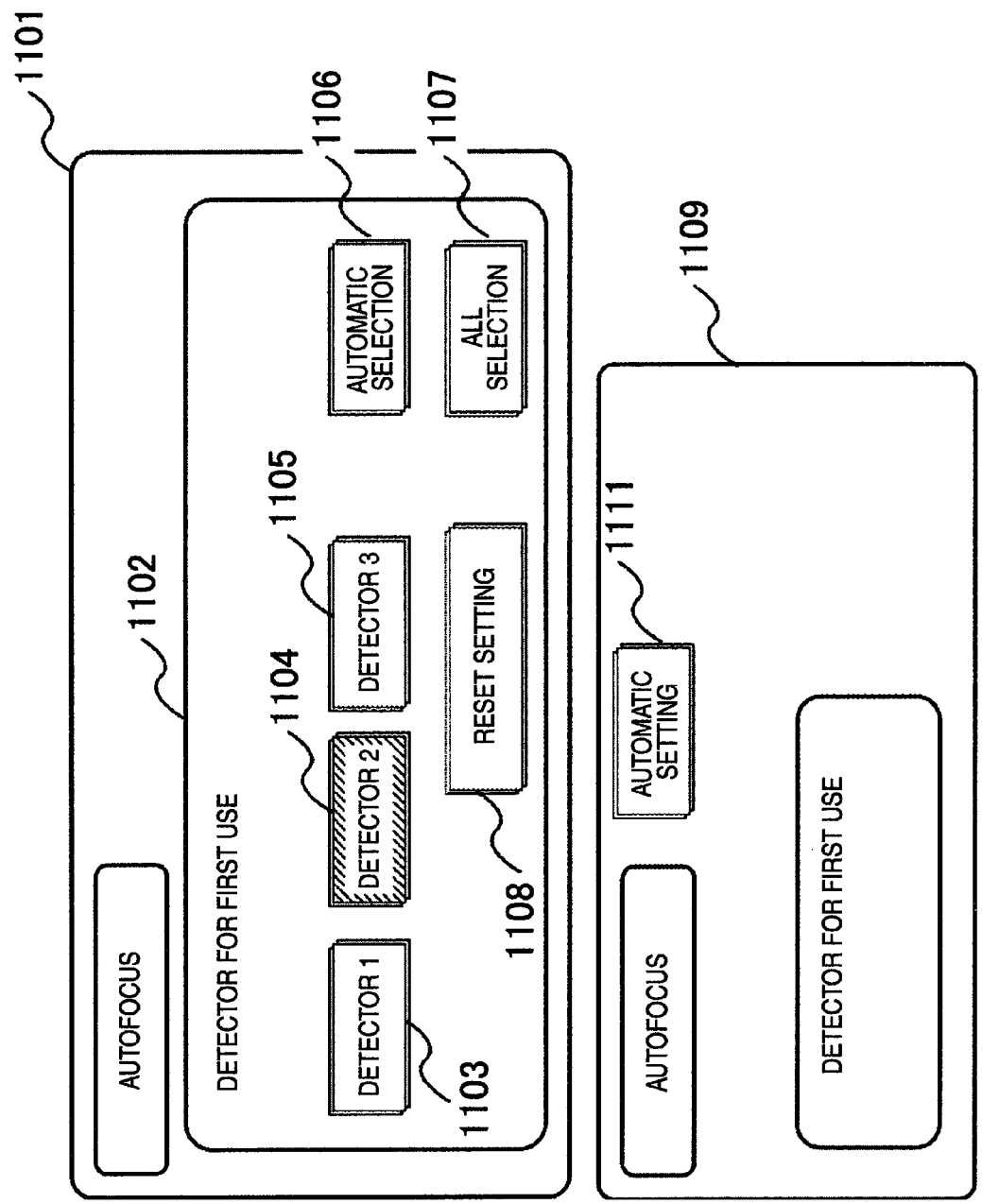
FIG. 11 shows a GUI used to set the operational contents of an autofocus function in embodiments 4, 5 or 6 of the present invention.

FIG. 10 shows a flow chart of the present embodiment 4. FIG. 11 shows a GUI for setting the operational contents of the autofocus function. The focus adjustment is carried out according to a procedure of steps 1001 to 1010. First of all, the system determines a detector to be imaged in the step 1001. At this time, the user can select the detector from a GUI such as a display screen 1101 shown in FIG. 11. Although the format of the GUI is not specifically limited to the format of the display screen 1101; such a method as to provide explanations shown in an area 1102 and that allows the user to select one of detectors by clicking one of buttons 1103, 1104 and 1105, is convenient as the format of the GUI. It is also desirable that the automatic detector selection (to be explained in the following discussion of this embodiment) be previously set as one of the choices at this time point. In FIG. 11, it corresponds to buttons 1106 and 1107. In the next step 1002, the system picks up images by the detector selected while shifting the focus position. In this step, a set of images having gradually varied focus states can be obtained. In the step 1003, next, the system calculates evaluation values for evaluating the focus states.

The evaluation values are calculated based on differential values of the images. A pattern edge or the like can be easily observed. Such a grayscale level change of an edge at the contour of an image in the focused state, however, is larger than a level change at a grayscale level change at the contour in the blurred image. From this consideration, a sum of pixel values after the image is differentiated is calculated and the sum is used as the evaluation value. Maximum one of such evaluation values is considered to be equal to a focused position.

The evaluation value and the fitting function are as already explained in FIGS. 4 and 5. Fitting operation is carried out using a prescribed fitting function, and an error between the function and the evaluation value becomes a certain guideline for determining whether or not the selected image is suitable for the autofocus adjustment. When the error data has an error level not larger than a constant value, the system goes to the step 1007 to calculate a focus position with the same data. When the error level is unsuitable, the system goes to a step 1005. When the system executes the operations of the steps 1001 to 1004 for all the images of the detector but still fails to have a small error from the fitting function in the step 1005, the system goes to a step 1009, returns the states of the objective lens and so on to their initial states prior to the start of the system without performing the focus calculation. The system then proceeds to a step 1010 to terminate the autofocus adjustment process. This operation can also be realized by shifting the system to the step 1007 using data about the detector having smallest one of so-far obtained errors for calculation. It is not necessary to carry out the above operation for all the detectors. When the system performs calculation for all the images of the detector, the system goes to a step 1006, changes the detector to another detector, and returns to the step 1002 to again acquire images.

The system calculates a peak position in the step 1007 and then proceeds to the step 1009. In the step 1009, the system sends a signal to the objective lens controller 112 so that the focus is adjusted at a focused position. Since the peak position of the evaluation value graph, that is, since the peak position 403 in FIG. 4 corresponds to the just-focused position, the system sends a control corresponding to this position. After completing the adjustment, the system goes to the step 1010 and terminates the autofocus adjustment process.

Embodiment 5

Figure 12:
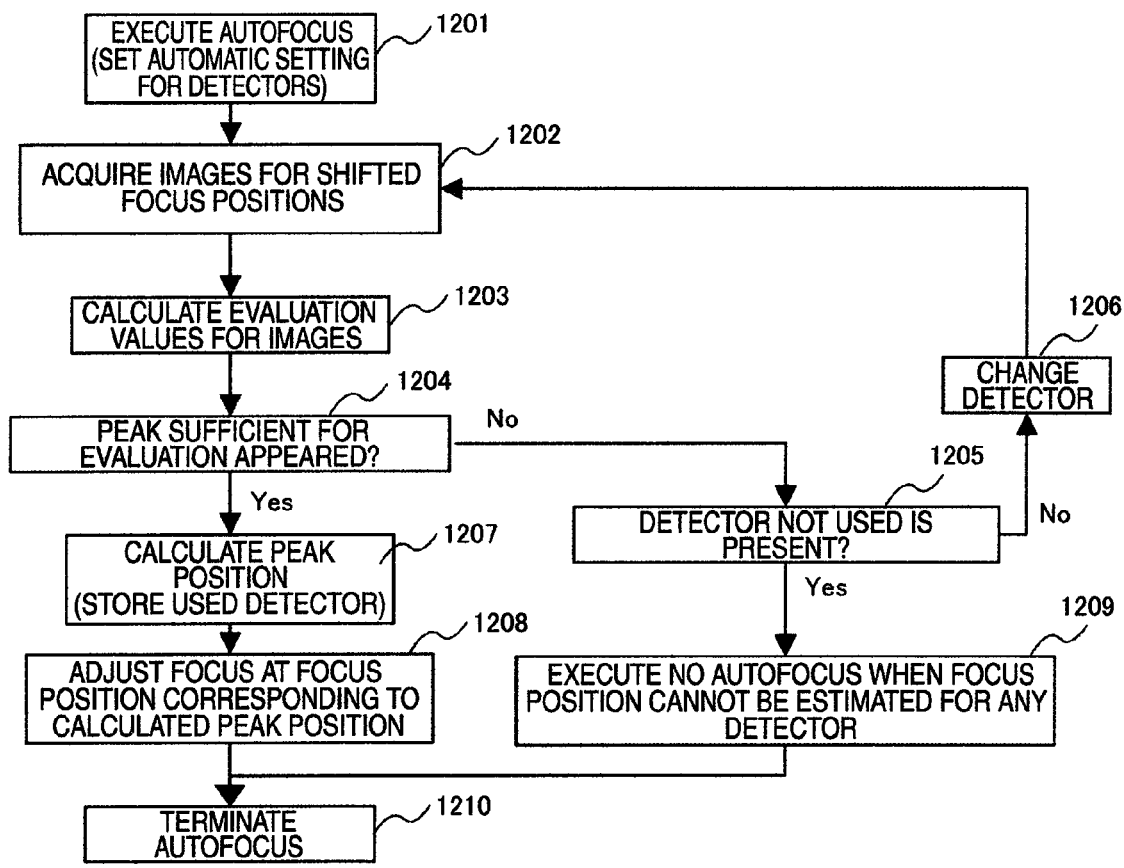
FIG. 12 is a flow chart for explaining the processing contents of the embodiment 5 of the present invention.

FIG. 12 shows a flow chart of this embodiment 5. This embodiment is basically the same as the embodiment 4, but different therefrom in a method of determining one of the detectors in the step 1201. The difference corresponds to a function of automatically setting the detector to acquire images. When the user selects an automatic detector selecting button 1106 in FIG. 11, this causes the number of the detector then used to be stored in the computer 118 each time that the system executes the autofocus operation. When the system sets a detector in a step 1201, the system sets one of detectors having highest one of frequencies of execution based on its history data. As a result, the system can reliably select images effective for focus adjustment and can efficiently perform focus adjustment. Since other steps 1202 to 1206 and 1208 to 1210 are the same as the steps 1002 to 1006 and 1008 to 1010 in FIG. 10 in the embodiment 4, detailed explanation thereof is omitted.

Detector changeover is not limited to the aforementioned example. The detector changeover can be realized based on probability and statistics, for example, the detector is not determined as a standard detector if the detector has been executed a predetermined number of times. Or the determination may be carried out on the basis of information on wafer including chip-in coordinate and chip position and information on wafer processing steps, wafer inspection apparatus, etc. For example, with regard to a wafer after subjected to the operation of a specific step, when the detector 1 is effective for a specific part within a chip, the autofocus adjustment process can be efficiently executed by setting the detector 1 in its coordinate range from the beginning. As data to be used as the determination reference; data collected during observation of the wafer may be used, previously-prepared data may be used, or data corresponding to a combination thereof may be used. For history information, such a button 1108 as shown in FIG. 11 is provided so that a function of erasing the history can be previously set.

When the user sets such operation, as a setting example, such an automatic selection button 1106 as shown in FIG. 11 is provided so that automatic setting items can be provided and set in the area 1102 of the GUI for setting of detectors. However, this is given as an example and the present invention is not limited to the specific example. For example, the entire autofocus operation or other operation can be set so that an automatic setting button 1111 is provided and one of detectors is automatically selected in response to the selection of the detector through the above operation as shown by a display 1109 in FIG. 11. Although not shown by a setting item in the GUI, such an item may be set so that, when any of the detectors in the area 1102 is not selected, all the detectors are automatically selected.

Embodiment 6

Figure 13:
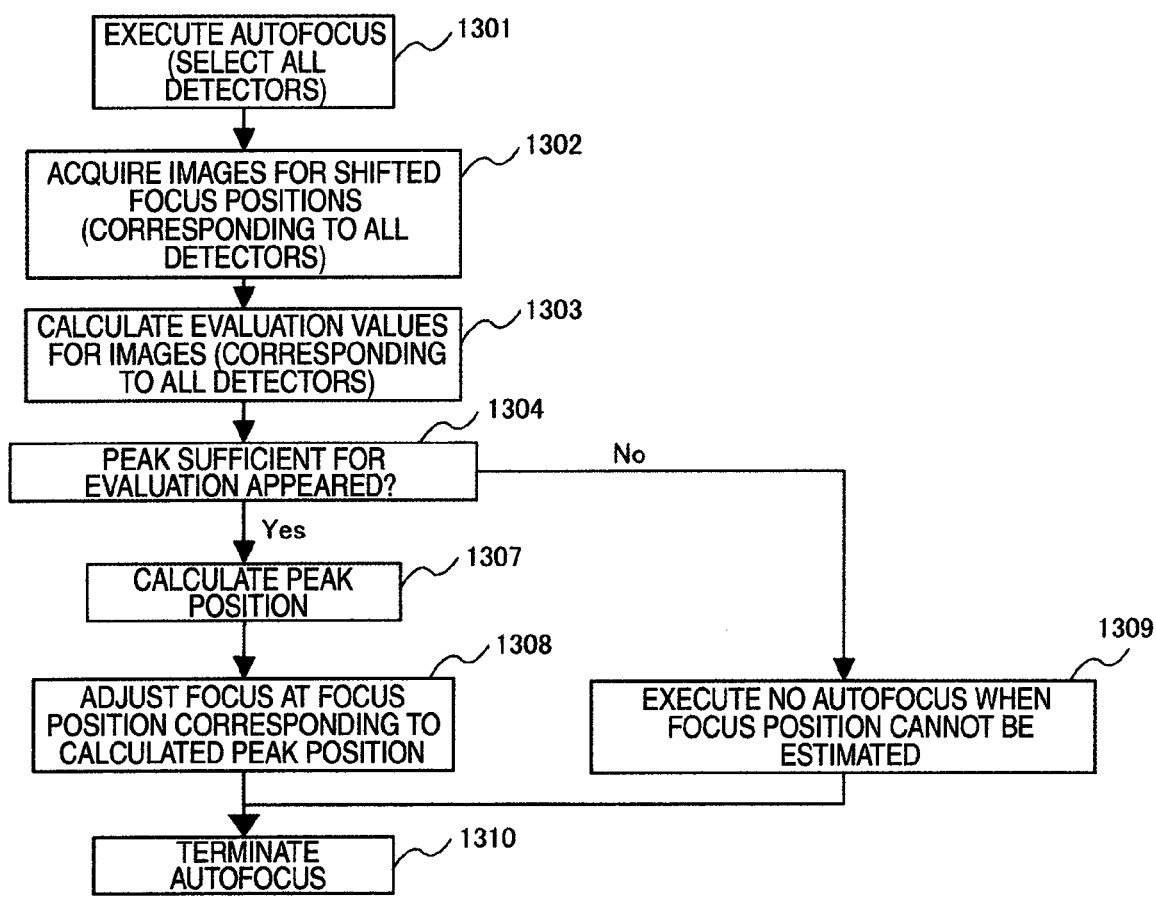
FIG. 13 is a flow chart for explaining the processing contents of the embodiment 6 of the present invention.

FIG. 13 shows a flow chart of the present embodiment 6. The present embodiment is different from the embodiments 4 and 5 in that all images are captured and evaluated at the same time. In a step 1302, a focus position is varied to acquire images from all the detectors. This step is similar to the step 1002 in FIG. 10 in the embodiment 4, except that images from all the detectors are acquired. In a step 1303, next, evaluation values for each detector are calculated and its graph is created. This step is also similar to the step 1003 in FIG. 10 in the embodiment 4, except that the evaluation value calculation is carried out for each detector. An fitting error is calculated by the computer 118 on the basis of this data for each detector in a step 1304, and processing operation is branched according to the error.

Figure 14:
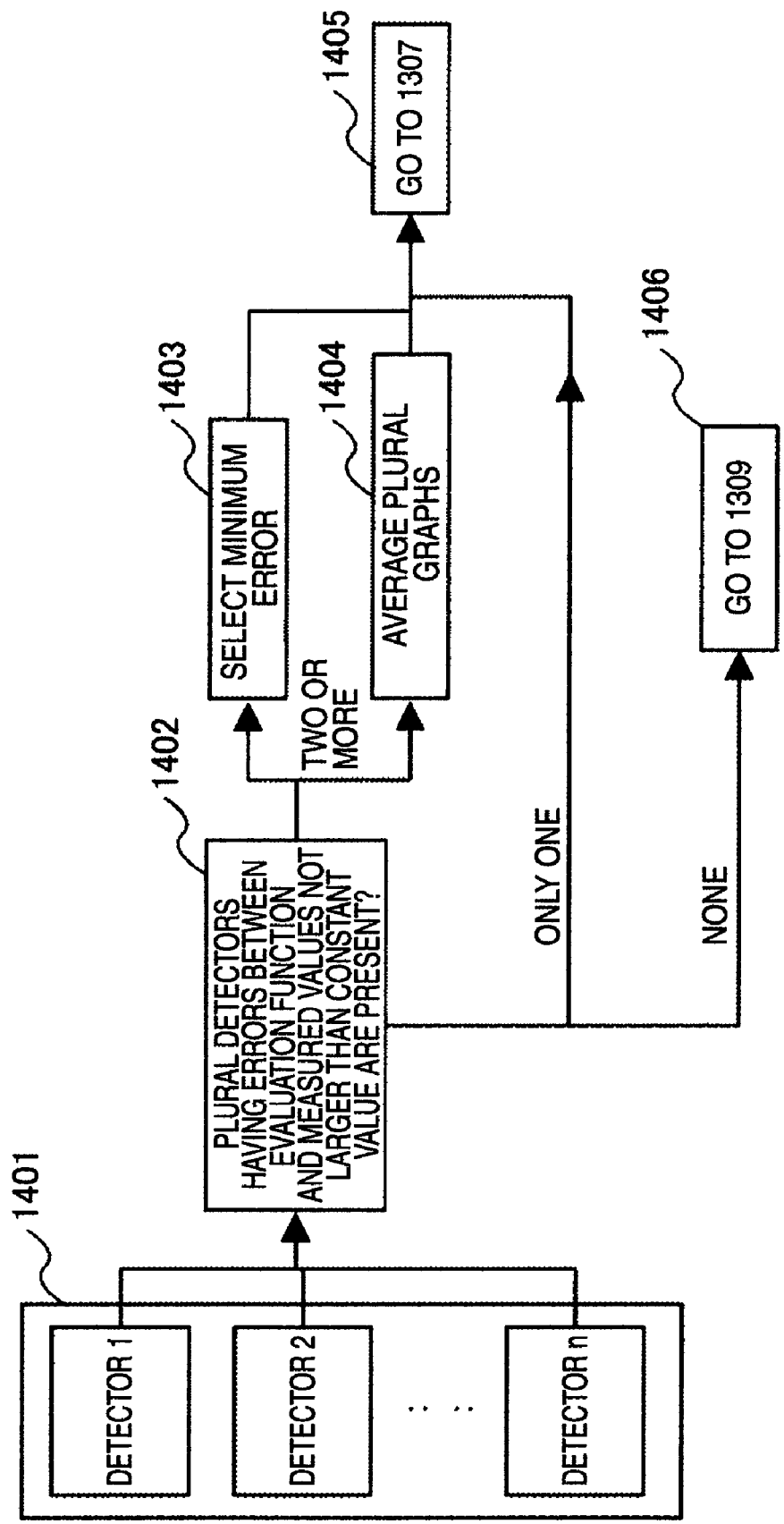
FIG. 14 is a flow chart for complementarily explaining the operation of a step 1304 in FIG. 13 in the embodiment 6.

Details of the branching operation is shown in FIG. 14. The system selects one or ones of fitting errors found in a step 1402 lying within a prescribed error range, on the basis of data from a group of the measured detectors 1401. When the system selects two or more fitting errors, the system selects smallest one of the detector errors as in a step 1403, and is used for the focus adjustment in a step 1405. As the selection determination reference, all the data within the prescribed error range can also be used and an average of the graphs can be set to be used in peak calculation (step 1404). When only one piece of data is present within the prescribed error range, the system performs focus adjustment using the data. When there is not present even a single piece of data within the range, the system goes to a step 1406 where the system performs operation when corresponding data is not present in the step 1309 of FIG. 13. In this way, when images of a plurality of detectors can be selected at the same time, images optimum for focus adjustment can be selected in single operation by evaluating the images at the same time. Since the operations of steps 1307 to 1310 are similar to the steps 1007 to 1010 of FIG. 10 in the embodiment 4, detailed explanation thereof is omitted.

Figure 15:
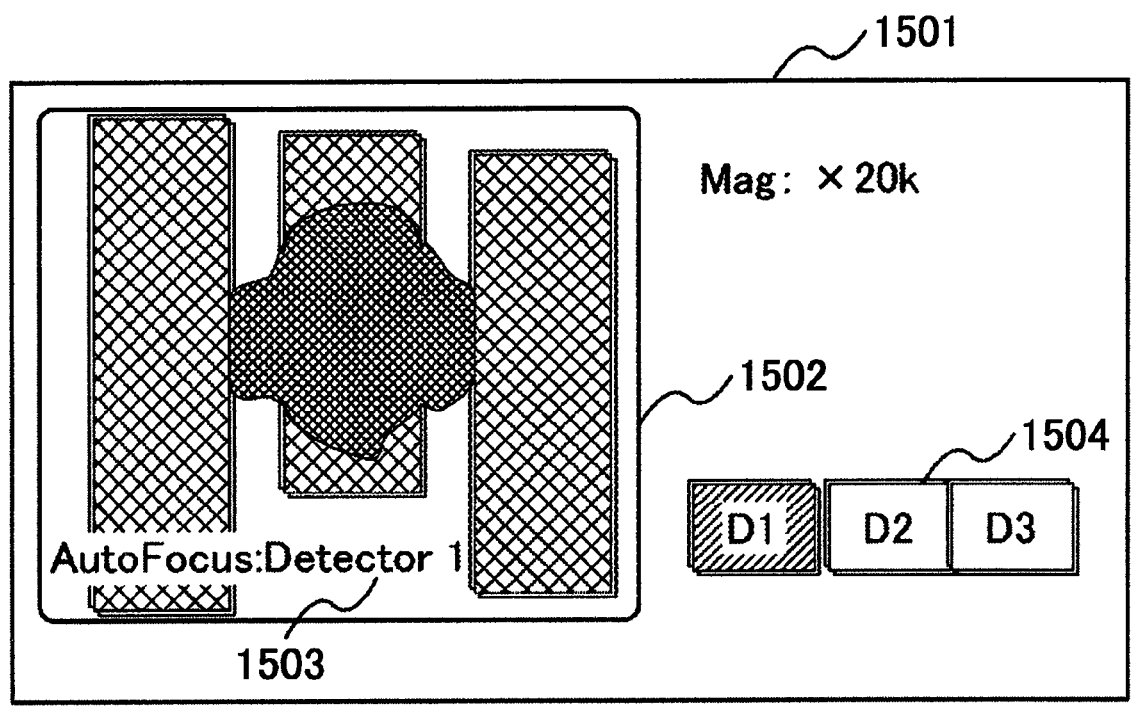
FIG. 15 is a display screen on which autofocus adjusting contents is displayed in the embodiment 6 of the present invention.
Figure 16:
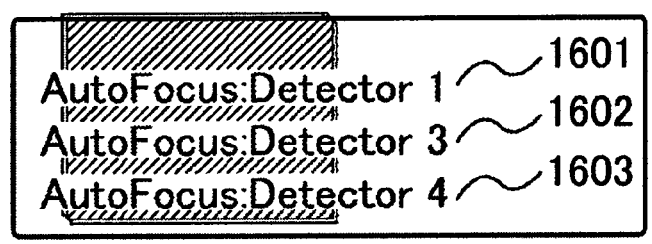
FIG. 16 is a display screen on which autofocus adjusting contents is displayed in the embodiment 6 of the present invention.

In all the embodiments 4 to 6, when whether which one of the detectors is executed or was executed before or after the autofocus execution is displayed on the display screen, the user can understand what operation now carried out, which is convenient. FIG. 15 shows an example of this case. In a display screen 1501 of the example, an image of the electron microscope is displayed in an area 1502, and information about the detector which executes the autofocus operation is expressed as a superimposition 1503 within the area 1502. The location of the information to be displayed is not limited to the inside of the frame of the area 1502 but may be outside of the frame. For example, marks 1504 corresponding to detectors D1, D2 and D3 may be provided so that, when the corresponding detector was used, the mark of the used detector is lit. The means for expressing the detector information is given only as an example and the present invention is not limited to the above example. As another display example, the corresponding detectors may be continuously displayed as superimpositions 1601, 1602 and 1603 as shown in FIG. 16. This expression is specially understandable to the user when the detectors are stepwise changed as in the embodiments 4 and 5.

As has been explained in the foregoing, in accordance with the above embodiments, when an image capable of being picked up only by a specific detector is included in images, stable autofocus adjustment can be attained by an electron microscope having a plurality of detectors which can pick up images from each detector while changing a focus position (Z) and evaluating part of the images or ones of the images stepwise or at the same time. Thus, the electron microscope can detect a focused position even when autofocus adjustment using a single image is difficult.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A system for obtaining a secondary electron image and reflected electron images of a specimen, having an auto-focusing operation, said system comprising:
    a scanning electron microscope including an objective lens that converges an electron beam to the specimen, at least one detector that outputs a signal for forming the secondary electron image, and at least one detector that outputs a signal for forming the reflected electron images; and
    a computer that evaluates a state of a focus based on a combined image which is generated by adding images of said secondary electron image and said reflected electron images in said auto-focusing operation.

2. A system according to claim 1, wherein said scanning electron microscope includes a pair of reflected electron detectors.

3. A system according to claim 1, wherein:
    said combined image is a computer calculated addition of images of said secondary electron image and said reflected electron images, and
    each of said said secondary electron images and said reflected electron images is multiplied by a preset coefficient value.

4. A system according to claim 3, wherein:
said computer calculates the addition under an equation expressed by $\alpha\cdot SE+\beta\cdot L+\gamma\cdot R$,
$\alpha$, $\beta$ and $\gamma$ denote coefficients respectively,
L, R denote the reflected electron image by said pair of reflected electron detectors, and
SE denotes the secondary electron image by said secondary electron detector.

5. A system for obtaining a secondary electron image and reflected electron images of a specimen, having an auto-focusing operation, said system comprising:
a scanning electron microscope including:
an objective lens that converges an electron beam to the specimen,
at least one detector that outputs a signal for forming the secondary electron image, and
at least one detector that outputs a signal for forming the reflected electron images;
one or more analog/digital converters that convert each signal to digital image data;
an image memory that stores a plurality of image data with different focus state regarding each of the secondary electron image and the reflected electron images;
a computer that retrieves images with same focus state from the image memory, generates a combined image by adding images of said secondary electron image and said reflected electron images in said auto-focusing operation, and evaluates the state of the focus based on the combined image.

6. A system according to claim 5, wherein said scanning electron microscope includes a pair of reflected electron detectors.

7. A system according to claim 5, further comprising a lens controller that controls the objective lens based on a focus adjustment transmitted from the computer.

* * * * *